United States Patent [19]

Arnold et al.

[11] Patent Number: 5,129,829
[45] Date of Patent: Jul. 14, 1992

[54] SOCKET FOR A MINIATURE INCANDESCENT LAMP

[75] Inventors: Werner Arnold, Bamberg; Georg Müller, Memmelsdorf-Merkendorf, both of Fed. Rep. of Germany

[73] Assignee: Paul Albrecht, Bamberg, Fed. Rep. of Germany

[21] Appl. No.: 717,445

[22] Filed: Jun. 19, 1991

[30] Foreign Application Priority Data

Jun. 19, 1990 [DE] Fed. Rep. of Germany ....... 4019495

[51] Int. Cl.[5] .................... H01R 9/09; H01R 13/73
[52] U.S. Cl. ...................... 439/56; 439/82; 439/558
[58] Field of Search ............. 439/56, 77, 82, 552-558

[56] References Cited

U.S. PATENT DOCUMENTS

| | | | |
|---|---|---|---|
| 4,152,622 | 5/1979 | Fitzgerald | 439/56 |
| 4,418,973 | 12/1983 | Smetana et al. | 439/558 |
| 4,593,958 | 6/1986 | Baba | 439/82 |

FOREIGN PATENT DOCUMENTS 1589314  3/1970  Fed. Rep. of Germany ........ 439/56

*Primary Examiner*—Paula A. Bradley
*Attorney, Agent, or Firm*—Jordan and Hamburg

[57] ABSTRACT

A socket for a miniature incandescent lamp for the detachable and lockable insertion in a recess in a printed circuit board and for making electrical contact with the lamp by pressing the connecting leads against the printed circuit board with a separate manufacture of the socket and the lamp, the socket consisting of a hollow cylinder with two axially superimposed parts of different external diameters, the cylinder, to accommodate the connecting leads of the lamp, having two diametrically opposite longitudinal slots, the width of which corresponds approximately to the diameter of the connecting leads and which extend over the whole height of the part of smaller diameter and into the part of larger diameter by an amount corresponding at most to the diameter of the connecting leads.

20 Claims, 2 Drawing Sheets

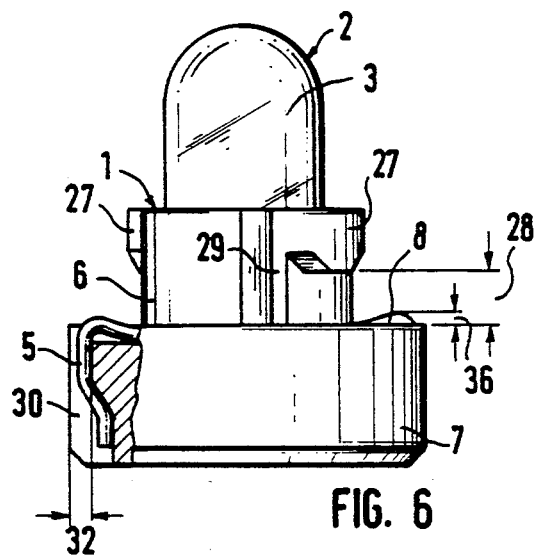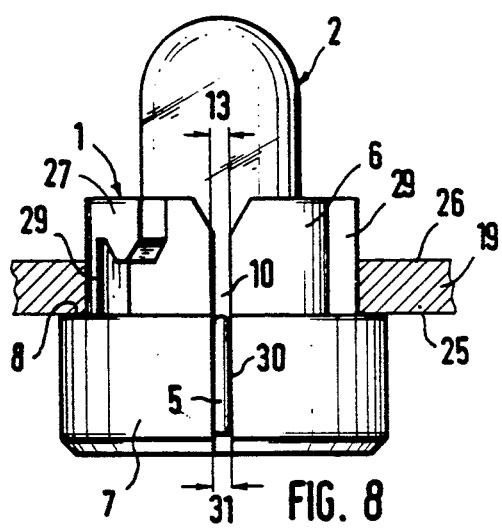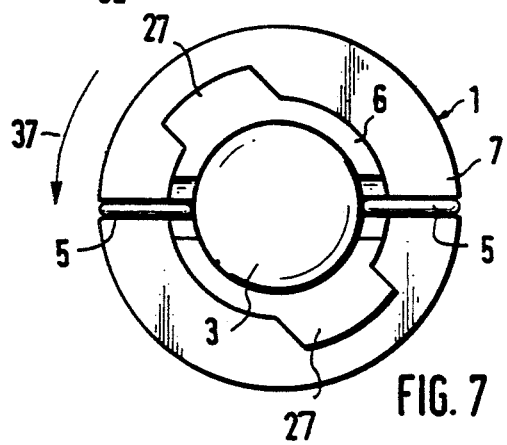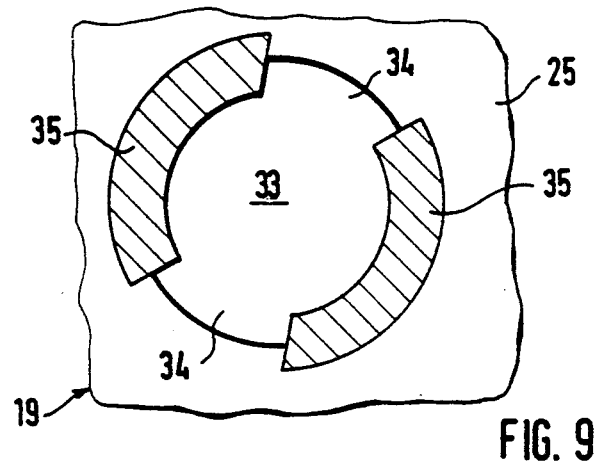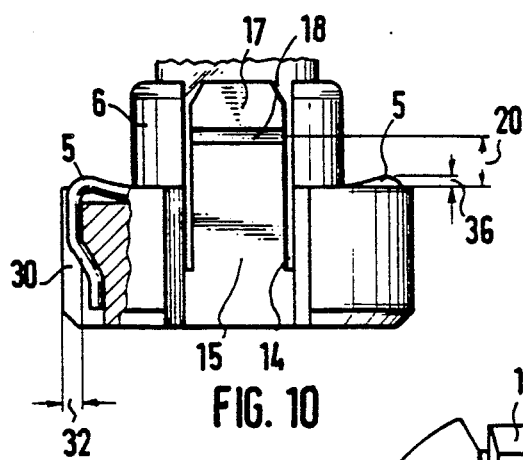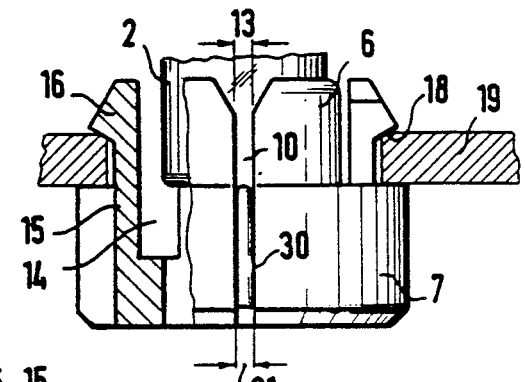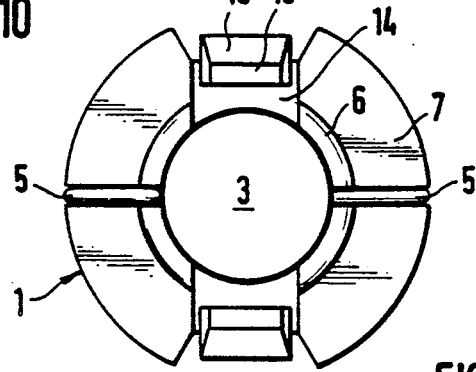

SOCKET FOR A MINIATURE INCANDESCENT LAMP

BACKGROUND OF THE INVENTION

The invention relates to a socket for a miniature incandescent lamp for the detachable and lockable insertion in a recess in a printed circuit board and for making electrical contact with the lamp by pressing the connecting leads against the printed circuit board with a separate manufacture of the socket and the lamp.

Such a socket is already known from U.S. Pat. No. 4,193,653. For this embodiment, the socket consists of a single part, through which the connecting leads of the lamp are passed. In the lower part of the socket, the leads form a loop in a guide in a flange. When the socket is inserted, the flange presses the connecting leads, which emerge at its upper side, against the underside of the printed circuit board.

This principle of making electrical contact between the connecting leads of the lamp and the printed circuit board has several advantages over constructions with integrated contact elements of metal or a conductive plastic, to which the connecting leads of the lamp are soldered, welded, riveted, wedged, glued, integrally molded or pressed. The socket can be produced in a single operation, because it consists of only a single plastic part. Since the glass bulb is not subjected to stresses either by temperature or by pressure during the insertion of the lamp, the material properties of the glass lamp are of no significance and the socket is suitable for all lamps of appropriate construction.

The manufacture of the socket of U.S. Pat. No. 4,193,653 is uncomplicated. However, the insertion of the lamp in the socket creates considerable difficulties. For this purpose, the lamp with the connecting leads aligned in parallel must first of all be brought into the socket, so that the connecting leads pass through an opening for each in the bottom of the socket. Subsequently, each connecting lead is threaded at least twice more through recesses provided for this purpose in a flange in the base. The fact that the connecting leads of the lamp generally are very thin and are easily bent if they are not introduced without making contact, is particularly disadvantageous. Inserting the lamp in the socket by hand is therefore unreasonable, even in the case of small numbers. It is therefore out of the question to sell the lamp and the socket separately. Instead, the lamp must be offered with the socket as a finished unit. Moreover, the insertion of the lamp in the socket requires complicated, precision and therefore expensive machines.

SUMMARY OF THE INVENTION

It is an object of the invention to design a socket of the initially described type in such a manner, that the insertion of the lamp in the socket and, particularly, the correct guidance of the connecting leads of the lamp does not present a problem and is possible with the simplest of tools and, if necessary, manually. To accomplish this objective, the socket of the initially described type consists pursuant to the invention of a hollow cylinder with two axially superimposed parts of different external diameters. To accommodate the connecting leads of the lamp, the hollow cylinder has two diametrically opposed longitudinal slots, the width of which corresponds approximately to the diameter of the connecting leads and which extend over the whole height of the part of smaller diameter and into the part of larger diameter by an amount corresponding at most to the diameter of the connecting leads. As a consequence of this construction, the lamp with the connecting leads bent outwards can be inserted in the socket. In so doing, the connecting leads are guided in the slots of the socket and limit the insertional movement of the lamp when they come up against the bottom of the longitudinal slots. For this process, the snug fit of the wires in the slots can be taken into account. The unit of socket and lamp is then introduced with the glass bulb in front from the underside of the printed circuit board into the recess of the latter, until the printed circuit board comes up against the connecting leads. During this procedure, the connecting leads form, as it were, a stop, which prevents the further penetration of the socket into the opening of the printed circuit board. The contacting pressure, exerted by the printed circuit board on the connecting leads, produces a reliable electrical contact between the leads and the contact surfaces on the underside an printed circuit board. An additional deformation or a further threading of the ends of the connecting leads becomes unnecessary here.

It is within the scope of the invention that the socket consists of an elastic material and that two radially movable springs are disposed on the part of larger diameter parallel to the axis and offset by 90° to the slots disposed in the socket. With a catch head protruding outwards at their free end, these springs overlap the printed circuit board, pressing on the connecting leads lying in the slots. The catch heads are disposed at a distance from the shoulder of the cylinder of larger diameter. This distance is somewhat smaller than the average thickness of the printed circuit board.

It has also proven to be particularly advantageous that two radial depressions, each of which guides a shaft of the springs, are disposed at the recess of the printed circuit board that accommodates the socket. By these means, twisting of the inserted socket with respect to the printed circuit board is avoided and the connecting leads of the lamp always lie at the same place of the underside of the printed circuit board. The contact surfaces can therefore be limited to a small sector at the periphery of the printed circuit opening, offset by 90° to the radial depressions of the printed circuit board.

It is within the scope of the invention that the springs are disposed in radial recesses of the hollow cylinder and are integrally molded with their foot to the part of larger diameter of the socket. Recesses in the cylinder of lesser diameter in the form of depressions or slots in the region of the springs increase the free spring excursion of the catch heads. These catch heads can be constructed larger, as a result of which the socket is also suitable for printed circuit boards, the thickness of which has a greater tolerance. To extend the spring excursion, the recesses, which accommodate the springs, can extend as far as into the cylinder of larger diameter. The depth of these recesses is limited by the requirement of an adequate stability of the socket.

An alternative embodiment of the invention is distinguished owing to the fact that, at the external periphery of the smaller diameter part of the socket, two clamping heads, which overlap the printed circuit board, are integrally molded directly. The axial distance of these clamping heads from the shoulder of the part of larger diameter corresponds approximately to the thickness of the printed circuit board. The clamping heads reach through appropriate depressions in the printed circuit board and can be locked with respect to this by rotation of the socket. By these means, a type of bayonet catch is formed. It is particularly advantageous not to dispose the clamping heads offset by 90° relative to the slots and to provide a clear direction of rotation for the locking. The slot nearer to a clamping head indicates the direction of rotation for the locking with respect to the clamping head. At the end of at least one clamping head, which is the rear end in the direction of rotation of the locking motion, a stop, which limits the rotational motion, is mounted in order to prevent the connecting leads of the lamp reaching the region of radial depressions of the opening of the printed circuit board, when the angle of twist is too large or when the rotation is in the wrong direction and being bent by the edge of this opening, when the direction of rotation is reversed.

Finally, in a further refinement, the invention provides for notches at the periphery of the part of the socket of larger diameter. These notches extend over the axial length of this part of larger diameter and are connected with the slots for accommodating the bent ends of the connecting leads. By guiding the ends of the connecting leads of the lamp, the danger of a short circuit with adjacent contacts is decreased appreciably. In the case of the socket with the bayonet catch, a bending of the wire during the locking operation can be avoided in this manner. Moreover, the possibility exists of bending the wire in such a manner, that it protrudes partially from the bottom of the slot and so produces a springiness, which supports the electrical contact.

Further characteristics, details and advantages of the invention arise out of the following description of some preferred embodiments of the invention, as well as out of the drawings.

BRIEF DESCRIPTION OF THE DRAWINGS

FIG. 6 shows a front view of a second embodiment of the invention, together with the inserted lamp, FIG. 7 shows a plan view of FIG. 6, FIG. 8 shows the embodiment of FIG. 6, turned through 90° and inserted in a printed circuit board, FIG. 9 shows the underside of the associated printed circuit board together with the contact surfaces, FIG. 10 shows a front view of a further embodiment of the invention, FIG. 11 shows a plan view of FIG. 10, and FIG. 12 shows the embodiment of FIG. 10, turned through 90° and inserted in a printed circuit board.

DESCRIPTION OF THE PREFERRED EMBODIMENTS

Figure 1:
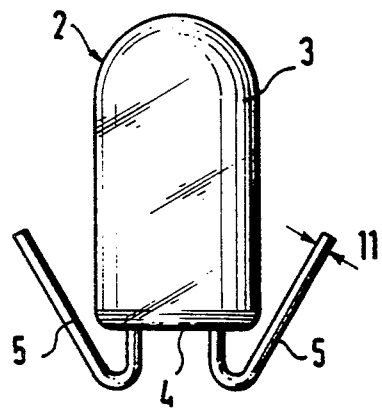
FIG. 1 shows a miniature incandescent lamp with bent connection leads, before insertion in the socket.
Figure 2:
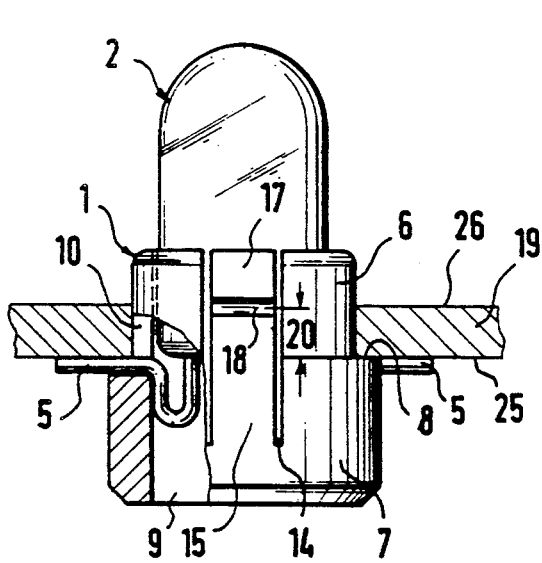
FIG. 2 shows a front view of a first embodiment of the invention after the insertion in a printed circuit board.
Figure 4:
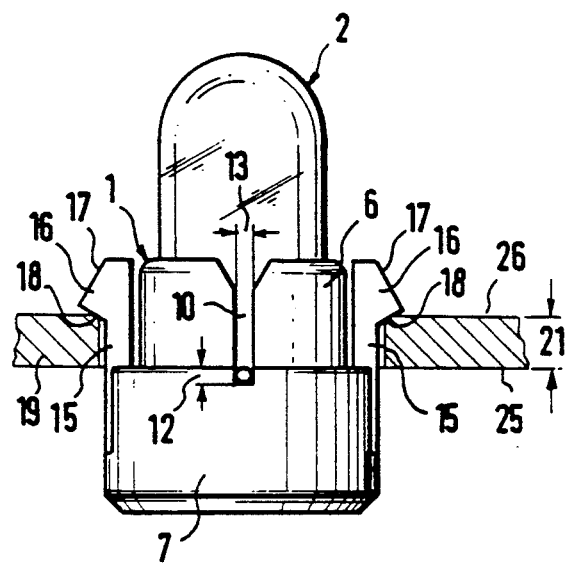
FIG. 4 shows the embodiment of FIG. 2, turned through 90°.
Figure 3:
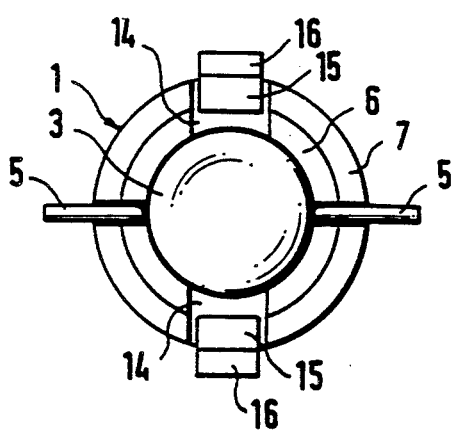
FIG. 3 shows a plan view of FIG. 2, without the printed circuit board.

A first embodiment is reproduced in FIGS. 2, 3 and 4. The socket 1 serves to accommodate the miniature incandescent lamp 2 with a cylindrical glass bulb 3, at the bottom of which two lamp connection leads 5 emerge. The points of emergence are approximately diametrically opposed with respect to the longitudinal axis of the glass bulb 3. Before the lamp 2 is inserted in the socket 1, the connecting leads 5 must be bent upwards at a distance from the bottom 4 of the glass bulb 3, which is small in relation to the length of the connecting leads 5, so that they form an angle of about 30° with the longitudinal axis of the glass bulb 3, as shown in FIG. 1. The socket 1 consists of an elastic material and is bounded towards the outside by the surface shells of two superimposed, concentric cylinders. The upper part 6 has a smaller diameter than the lower part 7, which is offset from the upper part 6 by means of a shoulder 8. A borehole 9, which intersperses the whole length of the socket 1, serves to accommodate the lamp 2. Two diametrically opposite longitudinal slots 10, which are parallel to the axis are provided in the upper part 6 of the socket 1. These slots 10 continue in the lower part 7 of the socket 1 by an amount 12, which corresponds approximately to the thickness 11 of the connecting leads 5 of the lamp. The width 13 of these slots 10 corresponds approximately to the diameter 11 of the connecting leads 5 of the lamp.

Two further slots 14, which are offset by 90° relative to the slots 10, are present. In the embodiments reproduced, these slots 14 intersperse the narrower cylindrical part 6 over the whole of its height and the wider cylindrical part 7 over about two thirds of its height. A spring 15 is integrally molded parallel to the longitudinal axis of the socket 1 at the bottom of each slot 14. The spring 15 is radially outside of the surface shell of the cylinder 6 of lesser external diameter and is radially movable within the slot 14 because of the low radial cross section of the shaft of spring 15. At the upper end of the spring 15, there is a catch head 16, which protrudes to the outside relative to the spring 15. The catch head 16 is divided into an upper side 17 and an underside 18 by an edge running transversely to the longitudinal axis of the socket 1. The upper side 17 is inclined slightly relative to the surface shell of the spring 15. The underside 18 runs at an acute angle to the plane of the printed circuit board 19 at an average distance 20 from the shoulder 8 of the broader cylindrical part 7, which corresponds to the thickness 21 of the printed circuit board 19.

Figure 5:
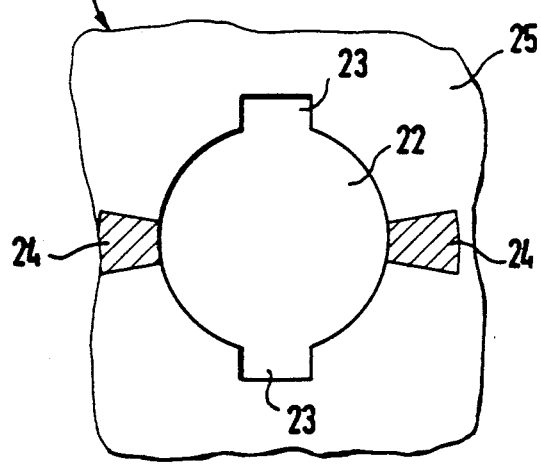
FIG. 5 shows the underside of the associated printed circuit board together with contact surfaces.

FIG. 5 shows a printed board 19 for accommodating this embodiment of socket 1. The printed circuit board 19 has an essentially circular recess 22, the diameter of which is at least equal to the diameter of the narrower socket part 6. Two rectangular depressions 23, disposed diametrically opposite one another at the circumference, correspond in their cross section and in their position to the shafts of the springs 15. The contact surfaces 24 consist of sectors with an opening angle of about 20°, which extend outwards up to a concentric circle with approximately the diameter of the wider socket part 7.

For insertion in the socket 1, the lamp 2 with the connecting leads 5 bent as shown in FIG. 1, is rotated about its longitudinal axis, until each connecting lead 5 engages a slot 10. The lamp 2 is now pushed from above into the socket 1, until the bent lamp connecting leads 5 lie on the bottom of the slot 10 in the wider part 7. Because of the slots 10, the socket 1 is radially flexible in the region of the narrower part 6, so that the glass bulb 3 can be held by means of a press fit and removed again at any time, for example, when it is burnt out. If the arrangement is exposed to high mechanical stresses, as is the case in motor vehicles, the glass bulb 3 can be fixed additionally with adhesive at the inside of the borehole 9.

The combination of socket 1 and lamp 2 is inserted with the glass bulb first from the underside 25 of the printed circuit board 19. In so doing, the combination is to be twisted about its longitudinal axis, so that the springs 15 are in alignment with the lateral recesses 23 of the printed circuit board opening 22. Since the spring heads 16 protrude outwards, they are resilient radially inwards in the slot 14 when pressed through the recesses 23 and finally again outwards on the upper side 26 of the printed circuit board 19.

When the socket 1 is inserted in the opening 22 of the printed circuit board, a twisting of the socket 1 relative to the printed circuit board 19 is prevented by the arrangement of the springs 15 outside of the surface shell of the cylindrical part 6 of lesser external diameter.

FIGS. 6, 7 and 8 show a different embodiment of the inventive socket. Unlike the previously described socket, the place of the springs is taken here by two diametrically opposite clamping heads 27, which are disposed at the cylindrical part 6 of lesser diameter at an angle other than 90° with the slots 10 and the distance 28 of which from the shoulder 8 of the cylindrical part 7 of larger diameter corresponds to the thickness 21 of the printed circuit board 19. At that end of the clamping heads 27, which is furthest removed from the next slot 10, these clamping heads 27 are constructed as cross members 29 of lesser diameter parallel to the axis over the whole length of the cylinder 6. Two notches 30, the width 31 and minimum depth 32 of which correspond to the diameter 11 of the connecting leads 5 of the lamp, extend diametrically over the whole height of the cylindrical part 7 of larger diameter and are connected with the slots 10 which have a depth 32.

FIG. 9 shows the associated printed circuit board 19 with the opening 33. The inner concentric circle, which bounds the opening 33, has at least the same diameter as the narrower part 6 of the socket 1. Two depressions 34, congruent with the clamping heads 27, are disposed diametrically opposite one another at the opening 33. The whole of the periphery between the depressions 34 serves as contact surface 35, which extends outwards in two halves up to a concentric circle of about the diameter of the wider socket part 7.

Since the wires 5 are bent by more than 90° before the lamp 2 is inserted in the socket 1, they protrude at an angle from the bottom of the slot 10 after the insertion. To protect the ends of the connecting leads 5 of the lamp, they are offset towards the wider part 7 of the socket 1 and pressed into the notches 30. At the same time, the connecting leads 5 of the lamp still protrude in the region of the shoulder 8 by a certain amount 36 from the slots 10.

The socket 1 is introduced into an opening 33 in the printed circuit board from the direction of the contacting side 25. In so doing, the clamping heads 27 are set in position against the recesses 34 in the opening 33 of the printed circuit board. If the socket 1 has been pushed in so far, that the bent connecting leads 5 of the lamp are pressed against the underside 25 of the printed circuit board, the clamping heads 27 are above the printed circuit board 19 and the socket 1 can be locked by twisting 37. The cross members 29 see to it that there is a defined direction of rotation 37 for the attachment and, at the same time, limit the angle of rotation.

In the case of this embodiment, the socket 1 assumes the task of a positive connection with the printed circuit board 19. Because of the projection 36, the connecting leads 5 of the lamp produce the contacting pressure required for establishing electrical contact with the printed circuit board 19. Additionally, the frictional forces between the printed circuit board 19 and the clamping heads 27 are increased by these means. This prevents the sockets 1 being twisted unintentionally out of the opening 33 of the printed circuit board.

The socket 1, which is shown in FIGS. 10, 11 and 12, combines the advantageous characteristics of embodiments 1 and 2. Unlike embodiment 1, socket part 7 of larger diameter is made wider and provided with two diametrically opposite notches 30 over its whole height. In the region of the shoulder 8, these notches go over into the slots 10. Their width 31 and minimum depth 32 correspond to the diameter 11 of the connecting leads 5 of the lamp.

The associated printed circuit board corresponds basically to that shown in FIG. 5. Because of the larger diameter of part 7, the contact areas 24 extend further towards the outside.

The lamp 2 is inserted in the socket 1 in the same way as in the case of embodiment 2; the socket 1 is inserted in an opening 22 of the printed circuit board in the same way as in the case of embodiment 1. The connecting leads 5 of the lamp, which protrude from the slots 10 by an amount 36, increase the contacting pressure and expand the tolerance range of the thickness of the printed circuit board 19, in which reliable contact between the leads 5 and the contact surfaces 24 is ensured.

The embodiments of FIGS. 2 to 4 and 10 to 12 additionally have the advantage, that they can be mounted automatically in the printed circuit board. For this purpose, the lamps can be supplied either on a pallet lined up on a plastic belt or on a stick ("curtain rod") appropriate for a gripping device of an automatic assembly machine. Moreover, the embodiment of FIGS. 2 also has the advantage that it can be soldered by wave soldering, since the glass envelope is protected by the plastic part during the soldering process (tension stesses would result if there were direct contact between the hot soldering tin and the glass bulb). Accordingly, on passing through a wave soldering installation, the projecting electrodes 5 can be soldered automtically. Up to now lamps could only be soldered manually in applications, which required a low overall height from the upper side of the printed circuit board up to the top of the glass bulb.

What is claim is:

1. A socket for a miniature incandescent lamp for detachable insertion in a recess in a printed circuit board and wherein electrical contact is made between connecting leads of the lamp and the printed circuit board, the socket comprising a hollow cylinder having an interval passage for receiving at least a portion of said lamp, said cylinder having two axially superimposed parts of different outer diameters, said cylinder having two diametrically opposed axial slots for accommodating said leads of said lamp, said slots having a width which corresponds approximately to the diameter of said leads, said slots extending along the entire axial length of the smaller diameter cylinder part, said slots extending into the larger diameter cylinder part an axial distance which is at least equal to the diameter of said leads.

2. A socket according to claim 1, wherein said notches extend the entire axial length of said larger diameter cylinder part, said notches opening up onto the outer periphery of the larger diameter cylinder part.

3. A socket according to claim 1 further comprising biasing means on said cylinder for biasingly retaining said socket on said printed circuit board.

4. A socket according to claim 3, wherein said biasing means are formed by two circumferentially spaced slits which extend axially of said smaller diameter cylinder part and which extend partially into said larger diameter cylinder part, said biasing means comprising a spring part disposed between said two spaced slits and integrally joined to said larger diameter cylinder part.

5. a socket according to claim 4, wherein said spring part is spaced ninety degrees from said slots.

6. A socket according to claim 4, wherein said spring part has an end portion having a radial outward protrusion, said larger diameter cylinder part having a shoulder where said larger diameter cylinder part joins said smaller diameter cylinder part, said printed circuit board being disposed between said shoulder and said protrusion.

7. A socket according to claim 6, wherein said shoulder has a channel generally aligned with said slot, said lead having a portion disposed in said channel.

8. A socket according to claim 7, wherein said channel extends in a radial direction.

9. A socket according to claim 1, wherein the smaller diameter cylinder part has integral radially outwardly extending clamping heads which overlap the printed circuit board, said cylinder having a shoulder where the larger diameter cylinder part joins the smaller diameter cylinder part, the distance between said clamping heads and said shoulder being approximately equal to the thickness of said circuit board.

10. A socket according to claim 9, wherein said smaller diameter cylinder part has stops to limit the rotation of the socket in said circuit board.

11. A socket according to claim 10, wherein said clamping heads have an outer diameter substantially equal to the outer diameter of said stops.

12. Apparatus comprising a miniature incandescent lamp having connecting leads, a socket for said lamp, a printed circuit board having an opening which receives said socket, said socket comprising a hollow cylinder having an interval passage for receiving at least a portion of said lamp, said cylinder having two axially superimposed parts of different outer diameters, said cylinder having two diametrically opposed axial slots for accommodating said leads of said lamp, said slots having a width which corresponds approximately to the diameter of said leads, said slots extending along the entire axial length of the smaller diameter cylinder part, said slots extending into the larger diameter cylinder part an axial distance which is at least equal to the diameter of said leads, and clamp means on said cylinder operable to engage said printed circuit board for clamping said socket within said opening of said circuit board with said leads contacting said circuit board.

13. Apparatus according to claim 12, wherein said opening in said circuit board is approximately equal to the diameter of said smaller diameter cylinder part.

14. Apparatus according to claim 12, wherein said opening in said printed circuit board has radial outwardly extending depressions, said depressions receiving said clamp means upon axial insertion of said socket into said opening, said socket being subsequently rotatable in said opening such that said clamping means move circumferentially away from said depressions to be disposed in superimposed relationship with said circuit board.

15. Apparatus according to claim 12, wherein said slots exend into said larger diameter cylinder part an axial distance approximately equal to the diameter of said leads, the portion of said slot extending into said larger diameter cylinder part being designated a slot section, said leads extending through said slot section in a direction generally parallel to said circuit board.

16. Apparatus according to claim 12, wherein said larger diameter cylinder part has a shoulder where said larger diameter cylinder part joins the smaller diameter cylinder part, said shoulder having a channel generally aligned with said slot, said leads being disposed in said channel and having a protruding part protruding at least partially from said channel, said protruding part contacting said circuit board.

17. Apparatus comprising a miniature incandescent lamp having connecting leads, a socket for said lamp, said socket comprising a hollow cylinder having an interval passage for receiving at least a portion of said lamp, said cylinder having two axially superimposed parts of different outer diameters, said cylinder having two diametrically opposed axial slots for accommodating said leads of said lamp, said slots having a width which corresponds approximately to the diameter of said leads, said slots extending along the entire axial length of the smaller diameter cylinder part, said slots extending into the larger diameter cylinder part an axial distance which is at least equal to the diameter of said leads, the portion of said slot extending into said larger diameter cylinder part being designated a slot section, said leads having a first part extending into said passage and a second part extending into said slot section.

18. Apparatus according to claim 17, wherein said lamp has a bottom end disposed in said passage of said socket, said first part of said leads extending from said bottom end into said passage, said second part of said leads extending out of said passage via said slot section.

19. Apparatus according to claim 17, wherein said larger diameter cylinder part has a shoulder where said larger diameter cylinder part joins the smaller diameter cylinder part, said shoulder having a channel generally aligned with said slot, said leads being disposed in said channel.

20. Apparatus according to claim 19, wherein said larger diameter cylinder part has an outer circumference, said larger diameter cylinder part having axial grooves opening up to said outer circumference, said leads being disposed in said grooves.

* * * * *